(12) United States Patent
Li et al.

(10) Patent No.: US 9,978,854 B2
(45) Date of Patent: May 22, 2018

(54) FIN FIELD-EFFECT TRANSISTOR

(71) Applicant: UNITED MICROELECTRONICS CORPORATION, Hsinchu (TW)

(72) Inventors: Jhen-Cyuan Li, New Taipei (TW); Shui-Yen Lu, Tainan (TW); Man-Ling Lu, Gueishan Township (TW); Yu-Cheng Tung, Kaohsiung (TW); Chung-Fu Chang, Tainan (TW)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 0 days. days.

(21) Appl. No.: 15/156,351

(22) Filed: May 17, 2016

(65) Prior Publication Data
US 2016/0260820 A1  Sep. 8, 2016

Related U.S. Application Data

(62) Division of application No. 14/548,239, filed on Nov. 19, 2014, now Pat. No. 9,373,718.

(51) Int. Cl.
*H01L 29/66* (2006.01)
*H01L 29/161* (2006.01)
(Continued)

(52) U.S. Cl.
CPC .... *H01L 29/66795* (2013.01); *H01L 21/3065* (2013.01); *H01L 21/3083* (2013.01);
(Continued)

(58) Field of Classification Search
CPC .................................................... H01L 29/161
(Continued)

(56) References Cited

U.S. PATENT DOCUMENTS 7,195,985 B2  3/2007  Murthy
7,494,858 B2  2/2009  Bohr
(Continued)

FOREIGN PATENT DOCUMENTS

CN          101622690          1/2010

OTHER PUBLICATIONS

Henri Jansen, Han Gardeniers, Meint de Boer, Miko Elwenspoek, Jan Fluitman, A survey on the reactive ion etching of silicon in microtechnology, Journal of Micromechanics and Microengineering—J Micromechanic Microengineer , vol. 6, No. 1, pp. 14-28, 1996.

*Primary Examiner* — Moazzam Hossain
*Assistant Examiner* — Omar Mojaddedi
(74) *Attorney, Agent, or Firm* — Ding Yu Tan

(57) ABSTRACT

An etching method adapted to forming grooves in Si-substrate and FinFET transistor manufactured thereof are provided. The etching method includes providing a silicon substrate, at least two gate structures formed on the silicon substrate and at least two gate spacer structures disposed on the silicon substrate; performing a first etching process on the silicon substrate to form a first groove, which has a base and two inclined sidewalls, ascending to respective bottoms of the gate structures, and are interconnected with the base, respectively; and performing a second etching process on the silicon substrate at the base of the first groove, so as to form a second groove in a trench shape, wherein the two inclined sidewalls of the first groove are interconnected with the second groove respectively, and the first etching process is substantially different from the second etching process.

9 Claims, 27 Drawing Sheets

(51) Int. Cl.
  *H01L 21/30*   (2006.01)
  *H01L 21/82*   (2006.01)
  *H01L 27/088*  (2006.01)
  *H01L 29/78*   (2006.01)
  *H01L 21/306*  (2006.01)
  *H01L 21/3065* (2006.01)
  *H01L 21/308*  (2006.01)
  *H01L 21/8234* (2006.01)
  *H01L 29/165*  (2006.01)

(52) U.S. Cl.
  CPC .. *H01L 21/30604* (2013.01); *H01L 21/30608* (2013.01); *H01L 21/823425* (2013.01); *H01L 21/823431* (2013.01); *H01L 27/0886* (2013.01); *H01L 29/7848* (2013.01); *H01L 29/165* (2013.01)

(58) Field of Classification Search
  USPC ........................................................ 438/297
  See application file for complete search history.

(56) References Cited

U.S. PATENT DOCUMENTS

| | | | |
|---|---|---|---|
| 7,709,312 B2 | 5/2010 | Jin | |
| 7,732,285 B2 | 6/2010 | Sell | |
| 7,821,044 B2 | 10/2010 | Bohr | |
| 7,875,521 B2 | 1/2011 | Shimamune | |
| 8,237,234 B2 | 8/2012 | Murthy | |
| 8,592,270 B2 | 11/2013 | Cheng | |
| 8,822,304 B2 | 9/2014 | Wang | |
| 2006/0148151 A1* | 7/2006 | Murthy | H01L 21/02381 438/197 |
| 2007/0020861 A1* | 1/2007 | Chong | H01L 21/76232 438/296 |
| 2008/0277699 A1* | 11/2008 | Chakravarthi | H01L 21/3065 257/289 |
| 2011/0220964 A1* | 9/2011 | Shin | H01L 21/30608 257/183 |
| 2012/0153387 A1 | 6/2012 | Murthy | |
| 2012/0161105 A1 | 6/2012 | Rachmady | |
| 2012/0181625 A1 | 7/2012 | Kwok et al. | |
| 2013/0119444 A1* | 5/2013 | Cheng | H01L 21/30604 257/288 |
| 2013/0171792 A1 | 7/2013 | Wan | |
| 2014/0008736 A1 | 1/2014 | Li | |
| 2014/0183642 A1 | 7/2014 | Liang | |
| 2015/0206939 A1 | 7/2015 | Huang | |

* cited by examiner

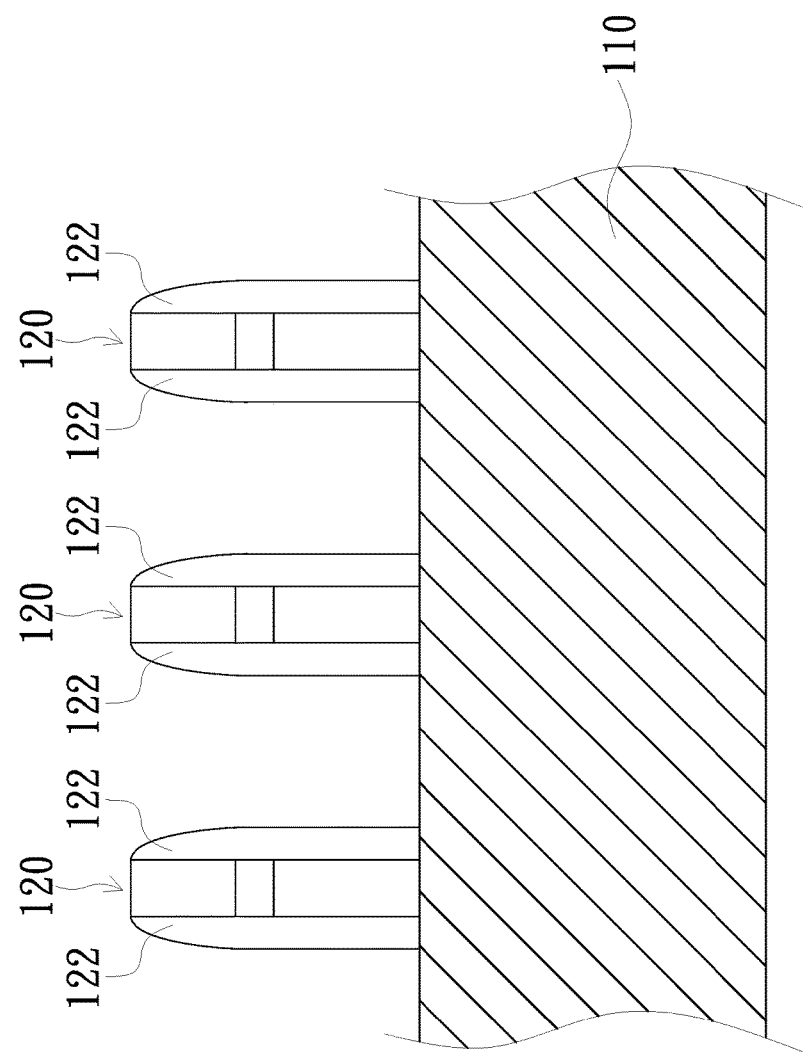

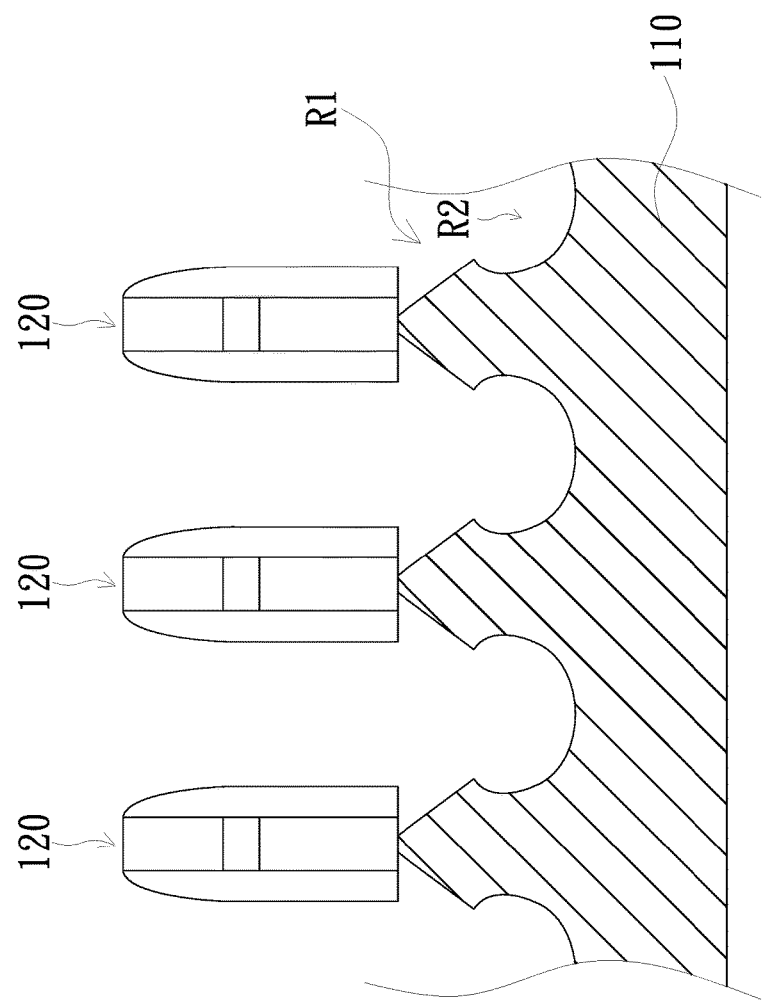

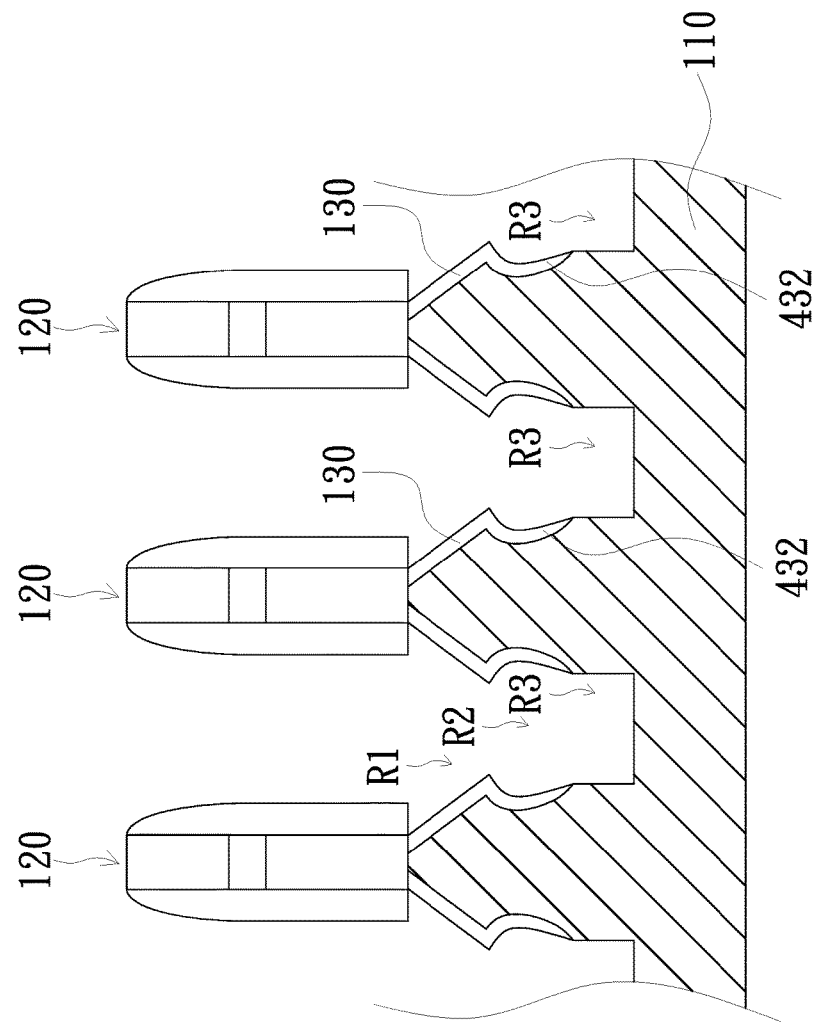

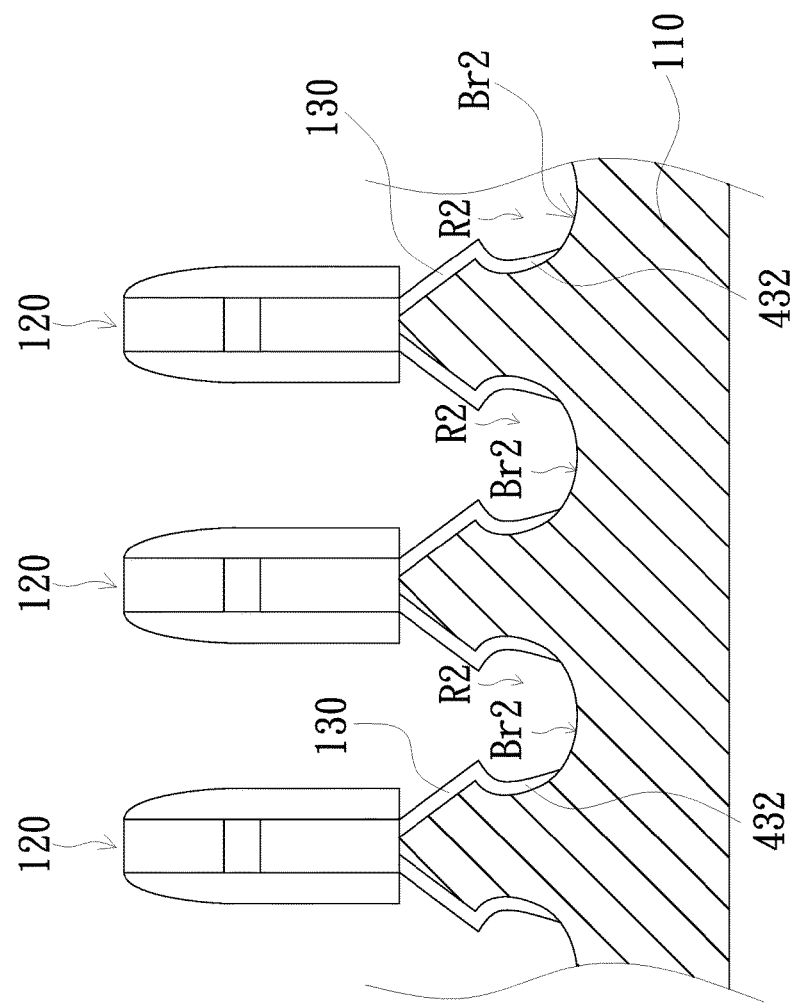

FIN FIELD-EFFECT TRANSISTOR

CROSS REFERENCE TO RELATED PATENT APPLICATIONS

This divisional application claims the benefit of U.S. patent application Ser. No. 14/548,239, filed Nov. 19, 2014 currently pending, and is incorporated by reference.

FIELD OF THE INVENTION

The invention relates to an etching method and semiconductor device structure, and more particularly to an etching method adapted for forming grooves in Si-substrate and a fin field-effect transistor (FinFET) manufactured thereby.

BACKGROUND OF THE INVENTION

When employing semiconductor processes for manufacturing a fin field-effect transistor (FinFET), it is always essential to grow a superior silicon germanium epitaxial material layer in a silicon substrate. Besides, prior to the growth of the silicon germanium epitaxial layer, it is necessary to form grooves in the silicon substrate, and then grow the silicon germanium epitaxial layer in the grooves in the Si-substrate.

However, since there are distinct electrical requirements for various types of transistor devices, it thus becomes necessary to grow silicon germanium epitaxial material layers in various shapes and depths. Under the circumstances, it will become insufficient to form grooves in the Si-substrate by simply utilizing a single etching process. However, once several etching processes have been carried out, it will become impossible to retain the specific contours of grooves, since the pre-formed grooves will suffer from the problem of over-etching, resulted from the corrosion by subsequent etching processes.

In view of the aforementioned reasons, there is a need to provide an improved etching method and a fin field-effect transistor (FinFET) device structure with a polygonal silicon germanium epitaxial material layer for solving the above-mentioned problems.

SUMMARY OF THE INVENTION

Hence, according to the invention, an etching method for forming grooves in Si-substrate and a fin field-effect transistor (FinFET) as manufactured thereby are provided, so as to meet the distinct electrical requirements for various types of fin field-effect transistor (FinFET) devices, and improve the electrical performance of devices.

In order to achieve the above advantages and the others, according to the invention, an etching method adapted for forming grooves in Si-substrate is provided, that includes providing a silicon substrate, at least two gate structures being formed on the silicon substrate and at least two gate spacer structures being disposed on the silicon substrate; performing a first etching process on the silicon substrate so as to form a first groove, wherein the first groove has a base and two inclined sidewalls, which are ascending to respective bottoms of the gate structures, are interconnected with the base, respectively; and performing a second etching process on the silicon substrate at the base of the first groove so as to form a second groove in a trench shape, wherein the two inclined sidewalls of the first groove are interconnected with the second groove, respectively, and the first etching process is substantially different from the second etching process.

Further, according to the invention, a fin field-effect transistor (FinFET) is provided, that comprises a silicon substrate; at least two gate structures disposed on the silicon substrate; at least two gate spacer structures; and a semiconductor structure. Here, the at least two gate spacer structures are disposed on the silicon substrate. Further, the semiconductor structure is embedded in the silicon substrate, and has an ascending portion and a portion in a trench shape that is interconnected with the ascending portion, wherein the ascending portion ascends to respective bottoms of the gate structures. Preferably, the semiconductor structure further includes a blind via portion that is interconnected with the portion in the trench shape.

Furthermore, according to the invention, a fin field-effect transistor (FinFET) is provided, that comprises a silicon substrate; at least two gate structures disposed on the silicon substrate; at least two gate spacer structures; and a semiconductor structure. Here, the at least two gate spacer structures are disposed on the silicon substrate. Further, the semiconductor structure is embedded in the silicon substrate, and has an ascending portion and a blind via portion that is interconnected with the ascending portion, wherein the ascending portion ascends to respective bottoms of the gate structures. Preferably, the semiconductor structure further includes a portion in a trench shape that is interconnected with the blind via portion.

In summary, according to the invention, several etching methods adapted for forming grooves in Si-substrate are provided, which involves utilizing dry etching and wet etching processes for forming first grooves with two ascending sidewalls to respective bottoms of the gate structures in advance, and further performing a surface oxidation process on the sidewalls of the grooves for forming a silicon oxide film adapted for preventing over-etching phenomenon, and sequentially carrying out a vertical-depression-formed dry etching process or a lateral-depression-formed dry etching process for forming subsequent second grooves or even third grooves, eventually the preparation of various of grooves in Si-substrate is accomplished. Moreover, silicon germanium epitaxial layers are so formed in the grooves in Si-substrate as to serve as an epitaxial drain structure or an epitaxial source structure in the fin field-effect transistor (FinFET). Accordingly, it is possible to meet distinct electrical requirements for various devices.

For making the above and other purposes, features and benefits become more readily apparent to those ordinarily skilled in the art, the preferred embodiments and the detailed descriptions with accompanying drawings are set forth in the following descriptions.

BRIEF DESCRIPTION OF THE DRAWINGS

The invention will become more readily apparent to those ordinarily skilled in the art after reviewing the following detailed description and accompanying drawings, in which:

FIGS. 1A-1F are cross-sectional views illustrating an etching method adapted for forming grooves in Si-substrate according to one embodiment of the invention.

FIGS. 3A-3C are cross-sectional views illustrating an etching method adapted for forming grooves in Si-substrate according to yet another embodiment of the invention.

FIGS. 4A-4E are cross-sectional views illustrating an etching method adapted for forming grooves in Si-substrate according to still yet another embodiment of the invention.

FIGS. 5A-5C are cross-sectional views illustrating an etching method adapted for forming grooves in Si-substrate according to still yet another embodiment of the invention.

DETAILED DESCRIPTION OF PREFERRED EMBODIMENTS

The embodiments will now be described more specifically with reference to the following embodiments. It is to be noted that the following descriptions of preferred embodiments are presented herein for purpose of illustration and description only. It is not intended to be exhaustive or to be limited to the precise form disclosed.

Figure 1B:
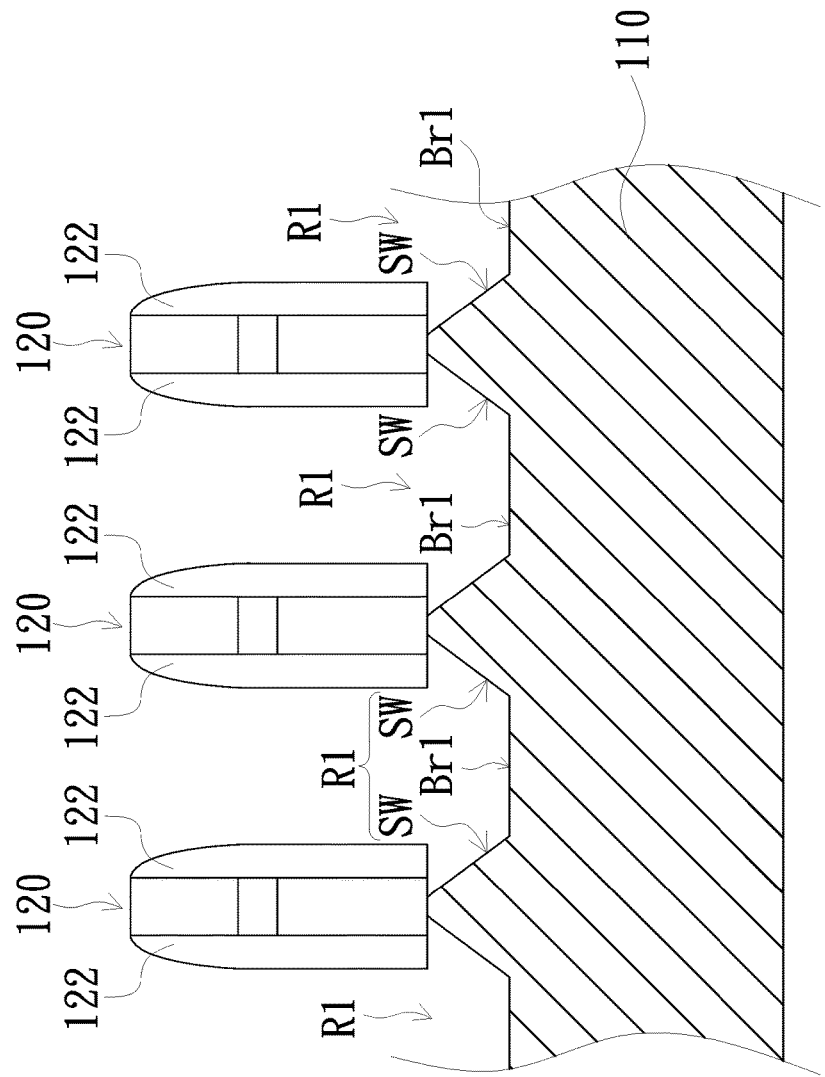

FIGS. 1A-1F are cross-sectional views illustrating an etching method adapted for forming grooves in Si-substrate according to one embodiment of the invention. Firstly, by referring to FIGS. 1A-1B as a whole, according to the one embodiment of the invention, the etching method adapted for forming grooves in Si-substrate includes providing a silicon substrate 110, wherein the silicon substrate 110 has at least two gate structures 120, and respective sidewalls of the gate structures 120 are encircled by a gate spacer structure 122; performing a first etching process on the silicon substrate 110 for forming a first groove R1, wherein the first groove R1 has a base Br1 and two inclined sidewalls Sw interconnected with the base Br1, respectively, and the two inclined sidewalls Sw ascend to respective bottoms of the gate structures 120. In FIG. 1A, the silicon substrate 110 is exemplified by three gate structures 120 disposed thereon, but it is not intended to limit the invention to such an example. Further, the first groove R1 is formed in the silicon substrate 110 between the adjacent gate structures 120.

It is notable that, the first etching process involves carrying out a dry etching process in advance, for removing a corresponding portion of the silicon substrate 110 so as to form the (partially-formed) first groove R1 roughly. Then, a wet etching process is utilized for eliminating or removing the residues, and the wet etching is further carried out and the ascending inclined sidewalls Sw are thus created along crystallographic planes of the silicon substrate 110 to respective bottoms of the gate structure 120, so as to form a (well-formed) first groove R1.

Figure 1C:
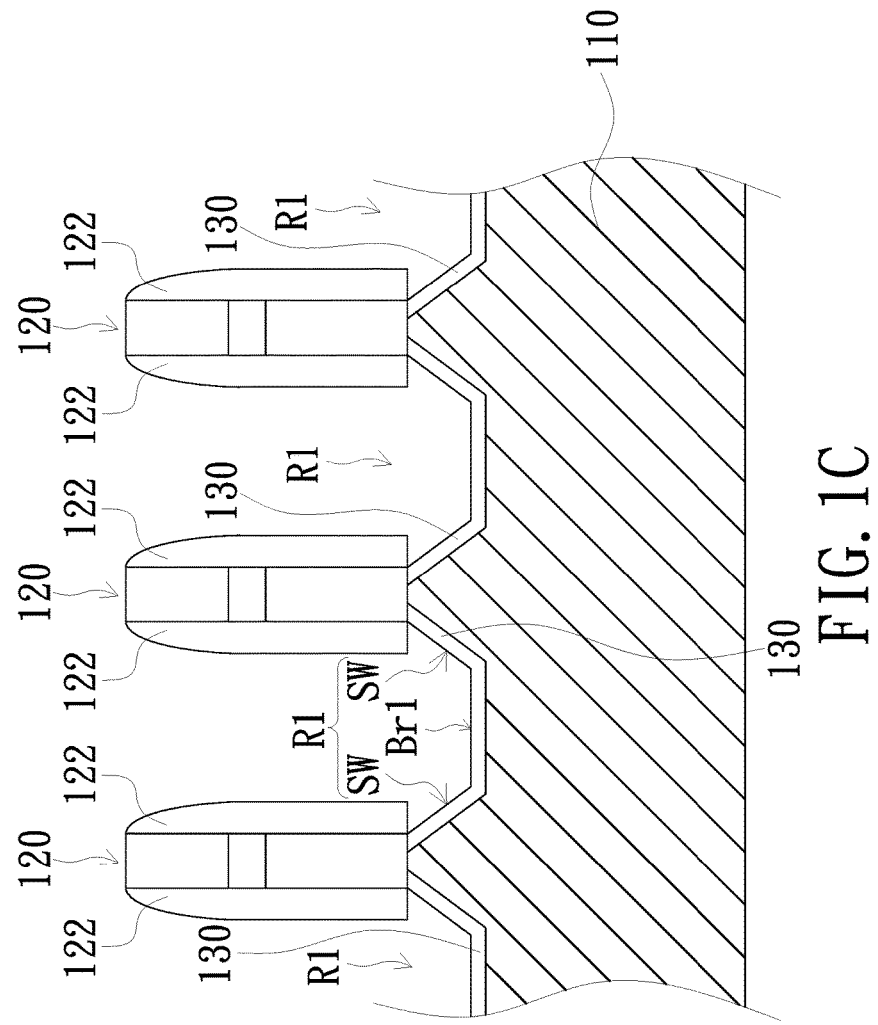
Figure 1D:
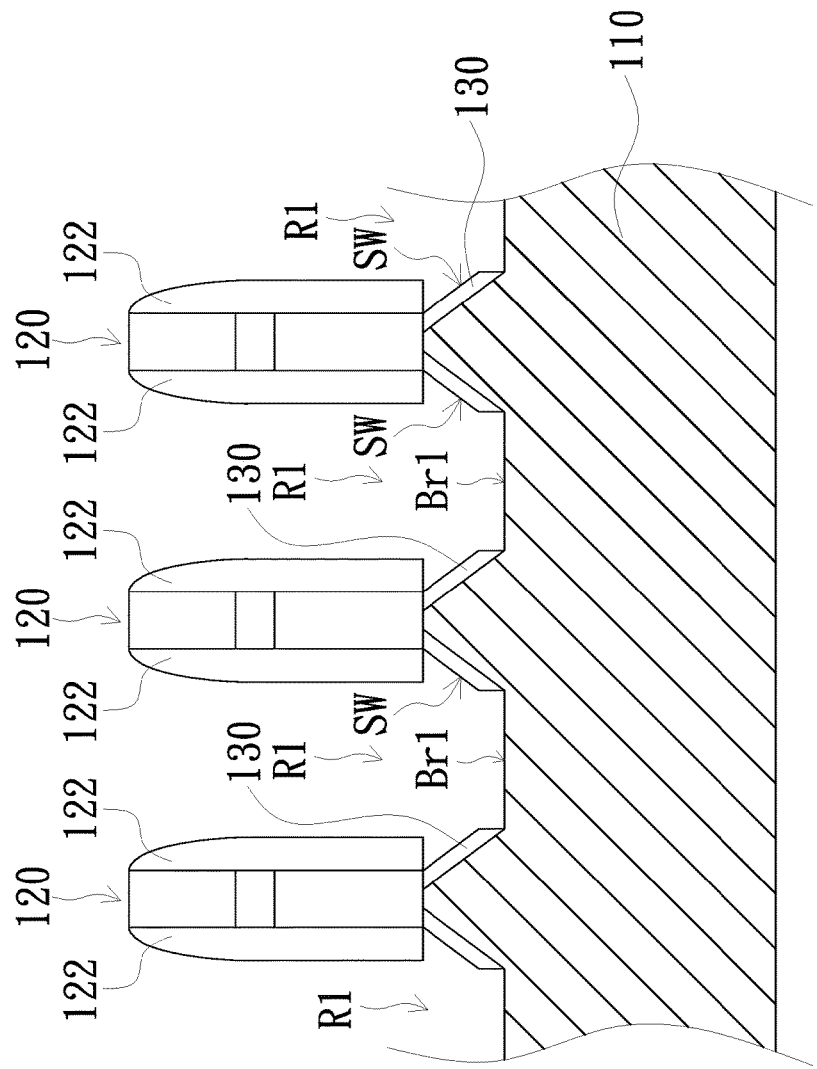

Again, by referring to FIGS. 1C-1D as a whole, after forming the first grooves R1, according to the one embodiment of the invention, the etching method adapted for forming grooves in Si-substrate further includes forming patterned protection layers in the first grooves R1, wherein the silicon substrate 110 at the base Br1 of the first groove R1 is exposed by the patterned protection layers, and the patterned protection layers are, for example, patterned silicon oxide films. Steps of forming the patterned silicon oxide films involve of carrying out a surface oxidation process on the exposed silicon substrate 110 in the first groove R1, so as to form a silicon oxide film 130 on surfaces of the exposed silicon substrate 110 in the first groove R1 (as shown in FIG. 1C), and then, a breakthrough etching process is carried out for removing the silicon oxide film 130 at the base Br1, so that the silicon substrate 110 at the base Br1 is exposed (as shown in FIG. 1D), eventually the preparation of patterned silicon oxide films is accomplished. Therefore, the patterned silicon oxide films merely consist of the silicon oxide films 130 formed on the ascending sidewalls Sw of the first grooves R1. The breakthrough etching process can utilize, for example, fluorine-containing plasma gas for removing the silicon oxide film 130 at the base Br1, wherein the fluorine-containing plasma gas is selected from the group consisting of carbon tetrafluoride ($CF_4$), hexafluoroethane ($C_2F_6$), octafluorocyclobutane ($C_4F_8$) and a mixture thereof.

Figure 1E:
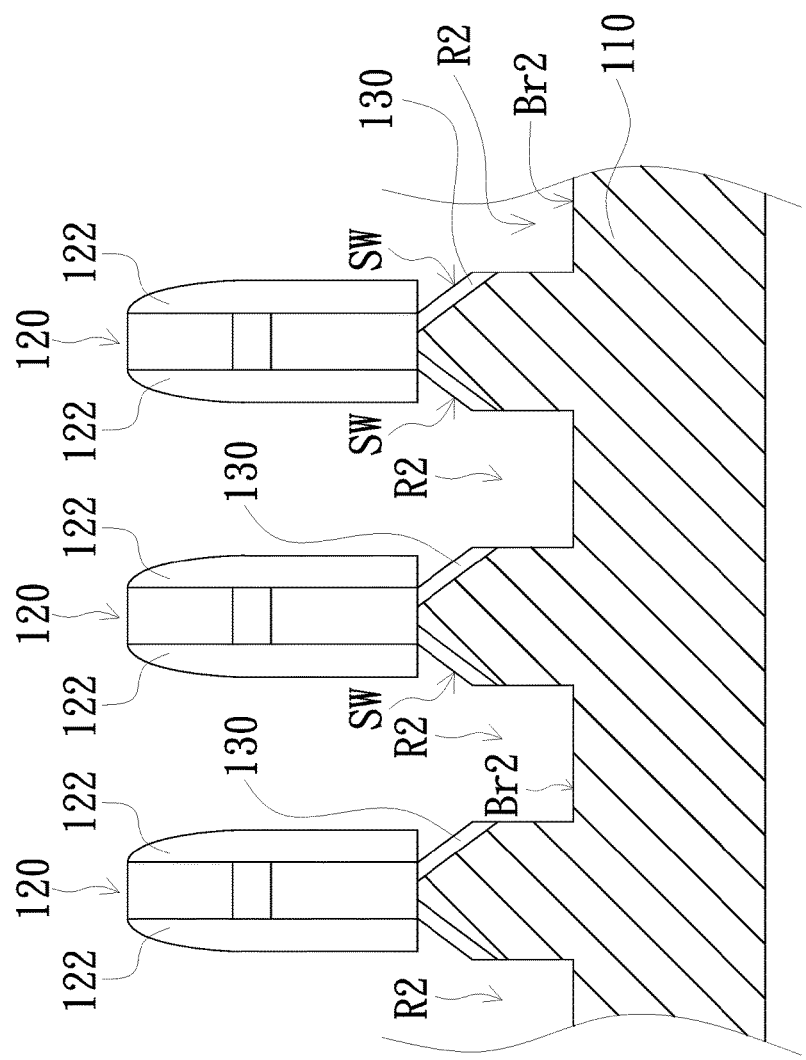
Figure 1F:
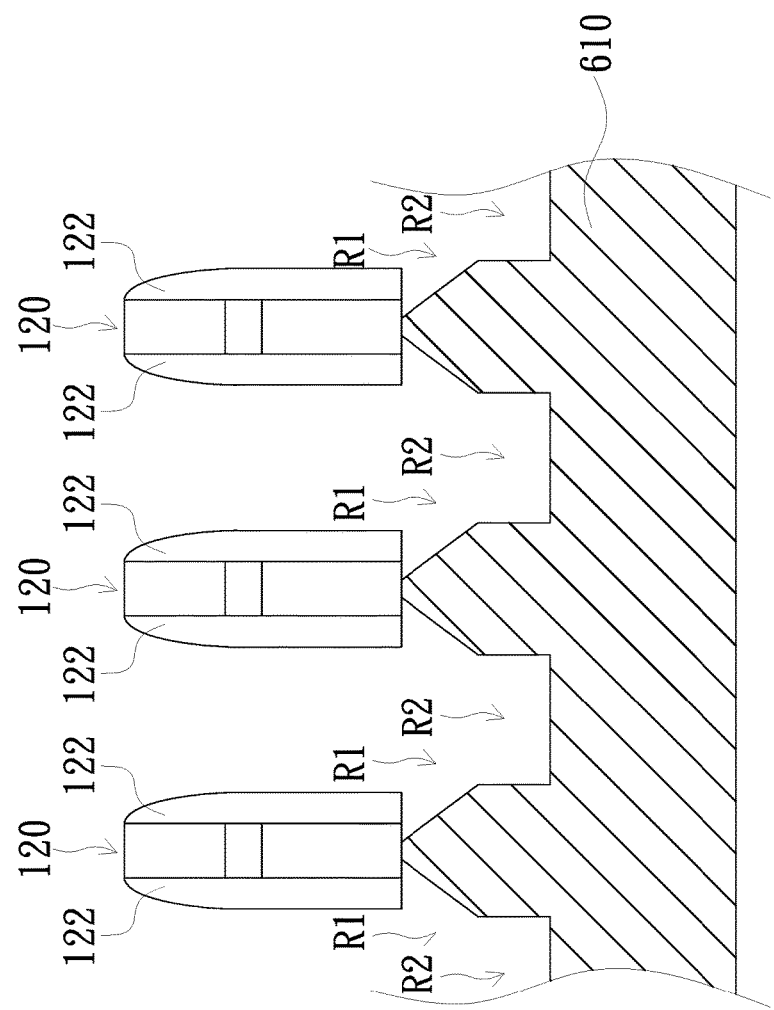

By referring to FIGS. 1E-1F, after removing the silicon oxide film 130 on the silicon substrate 110 at the base Br1, according to the one embodiment of the invention, the etching method adapted for forming grooves in Si-substrate further involves a second etching process performed on the base Br1 of the first groove R1, so as to form a second groove R2 in a trench shape or in an U shape, wherein the inclined sidewalls Sw of the first groove R1 interconnect with the second groove R2, respectively (as shown in FIG. 1E), and then, the wet etching process, for example, using the diluted hydrofluoric acid (DHF), is still employed for removing the silicon oxide films 130 disposed on the inclined sidewalls Sw, so as to accomplish the preparation of grooves in the Si-substrate. In the subsequent processes adapted for manufacturing fin field-effect transistor (Fin-FET) device, silicon germanium epitaxial layers are sequentially formed in the first and second grooves R1, R2 including the grooves in the Si-substrate, so as to form an epitaxial drain structure or an epitaxial source structure. Moreover, it is notable that, the second etching process is substantially different from the first etching process. The second etching process adapted for forming the second grooves R2 in the trench shape or in the U shape is an anisotropic etching method, for example, a vertical-depression-formed dry etching process. In addition, a first plasma gas as employed therein is, for example, hydrogen bromide (HBr).

It is worthy to mention that, prior to performing the second etching process, a purpose of overlaying the sidewalls Sw of the first grooves R1 with the silicon oxide films 130, via performing the surface oxidation process on the silicon substrate 110 in the first groove R1, resides or results in that the silicon oxide film 130 is used to protect the sidewalls Sw of the first groove R1 from being etched by the first plasma gas as employed in the vertical-depression-formed dry etching process, during the second etching process, so as to retain the contours of the sidewalls Sw of the first groove R1. Moreover, according to another embodiment, the patterned protection layer is, for example, a patterned polymer film. Therefore, a polymer film can be alternatively formed on the surface of the first groove R1, in replacement of (or in lieu of) forming the silicon oxide film via the surface oxidation process. Besides, once the polymer film on the base is removed, the preparation of the patterned polymer film will be accomplished. Then, the second etching process is subsequently carried out on the base of the silicon substrate, so as to form the second groove R2. The method for forming the polymer film involves, for example, in the use of difluoromethane ($CH_2F_2$) gas or trifluoromethane ($CHF_3$) gas for depositing the polymer film.

Figure 2A:
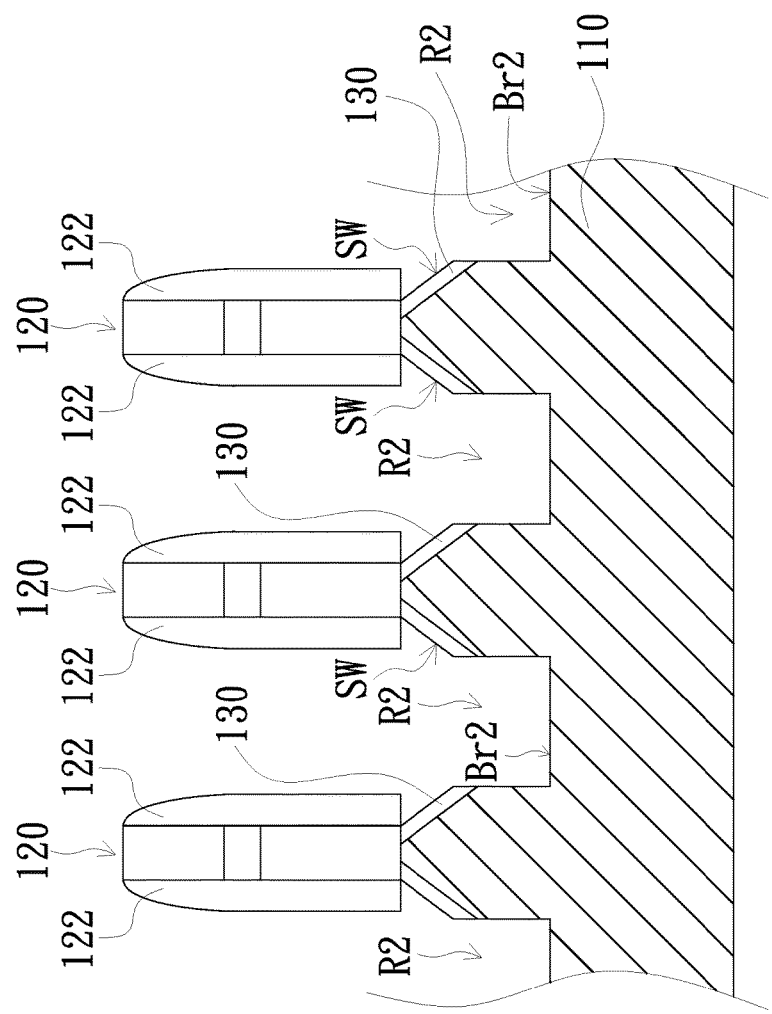
FIGS. 2A-2E are cross-sectional views illustrating an etching method adapted for forming grooves in Si-substrate according to another embodiment of the invention.
Figure 2B:
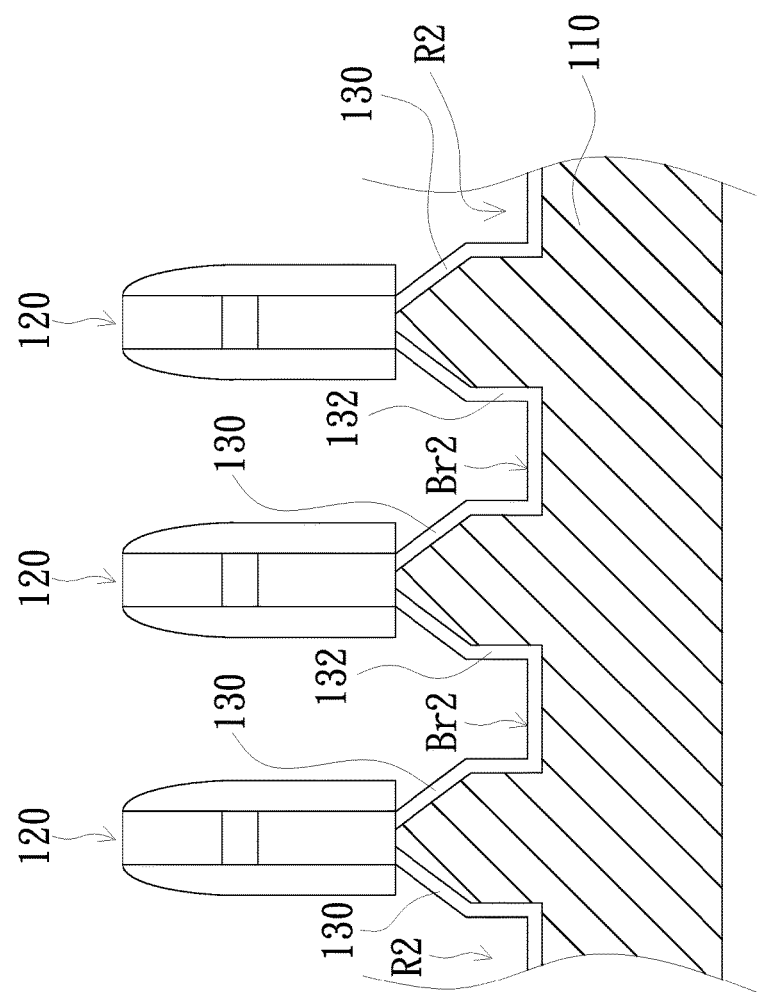
Figure 2C:
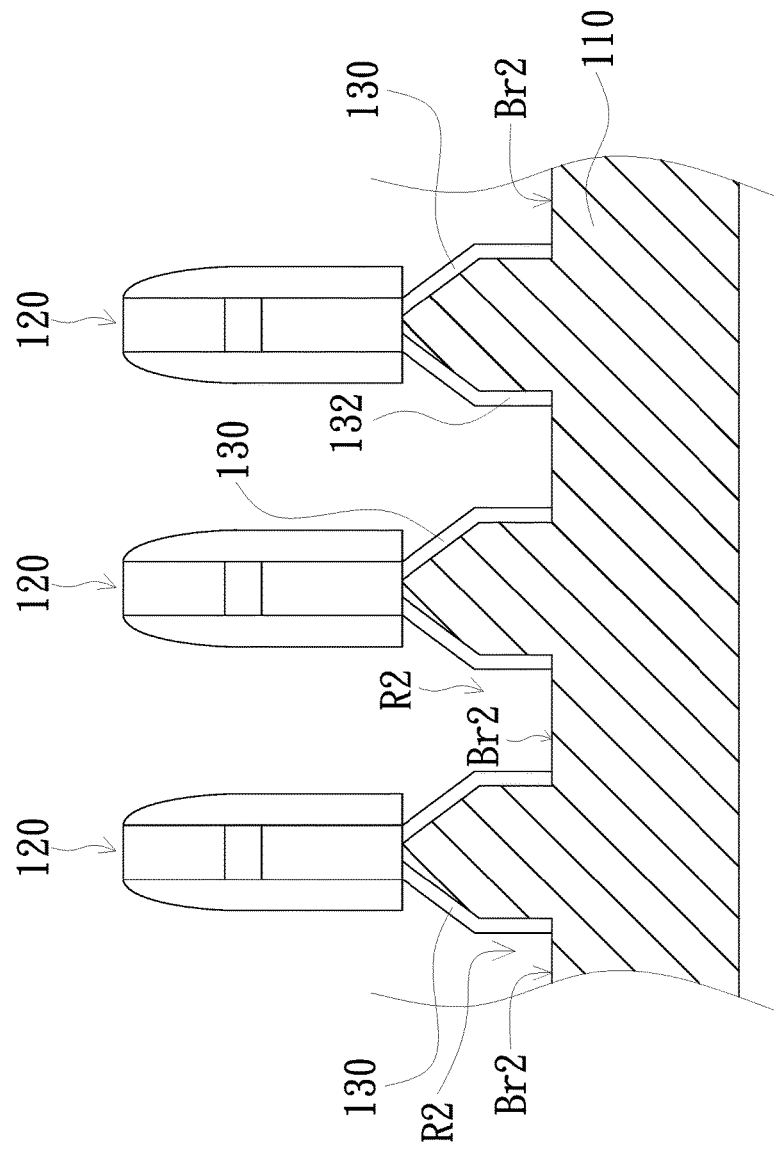
Figure 2D:
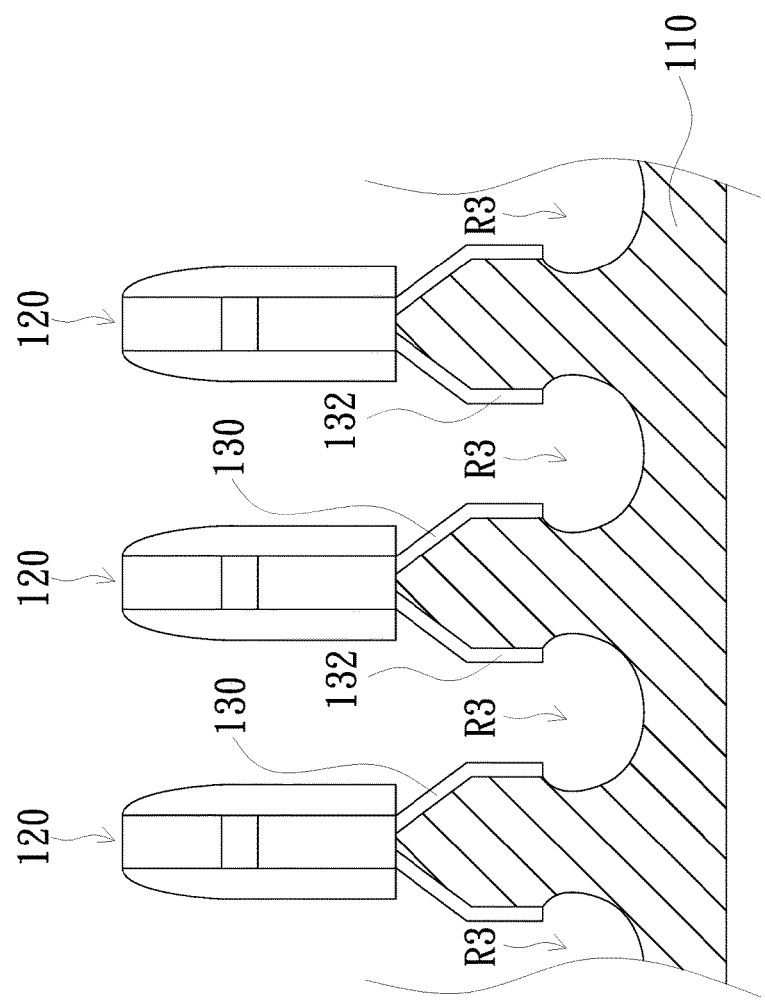
Figure 2E:
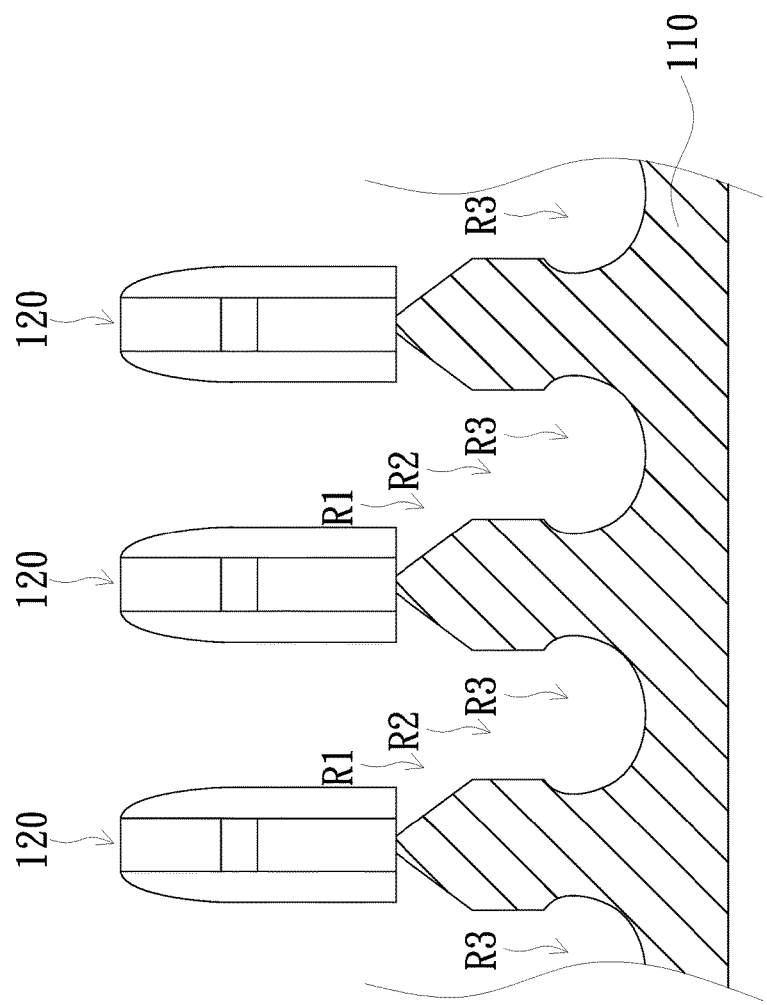

FIGS. 2A-2E are cross-sectional views illustrating an etching method adapted for forming grooves in Si-substrate according to another embodiment of the invention. After accomplishing the second groove R2 in the trench shape or in the U shape as shown in FIG. 1E, for example, it is still possible to sequentially perform etching processes on the silicon substrate at the base of the second groove R2, so that grooves configured in other shapes can be formed, via manufacturing processes set forth below. Firstly, preparing a device structure as shown in FIG. 1E, which is depicted in FIG. 2A as well. Prior to accomplishing the device structure of FIG. 2A, the previous processes are all the same as those of FIGS. 1A-1D, and duplicated descriptions are thus omitted. As illustrated in FIG. 2A, the two inclined sidewalls Sw of the first groove R1 are still overlaid with the silicon oxide films 130. In FIG. 2A, the sidewalls Sw can be overlaid by the polymer film alternatively, in replacement of the silicon oxide film, and thus, it is not intended to limit the invention to such an example. Next, by referring to FIG. 2B, a patterned protection layer is formed in the second groove R2, wherein the base Br2 of the second groove R2 is exposed by the patterned protection layer. The patterned protection layer is, for example, a patterned silicon oxide film, and steps of forming the patterned silicon oxide film in the second groove R2 involve performing a surface oxidation process on the exposed silicon substrate 110 in the second groove R2, so as to form a silicon oxide film 132 on the surface of the exposed silicon substrate 110 in the second groove R2 (as shown in FIG. 2B). Next, a breakthrough etching process is carried out for removing the silicon oxide film 132 at the base Br2 of the second groove R2, and the base Br2 of the silicon substrate 110 is further exposed (as shown in FIG. 2C), eventually the preparation of the patterned silicon oxide film is accomplished. Next, a third etching process, for example, a lateral-depression-formed dry etching process, is carried out on the silicon substrate 110 at the base Br2, so as to form a third groove R3 in a circular shape (as shown in FIG. 2D, a width of the third groove R3 is wider than a width of the second groove R2, wherein both the widths of the third groove R3 and the second groove R2 are defined along a direction parallel to an extending direction of the silicon substrate 110), wherein the third groove R3 interconnects with the second groove R2, and the second groove R2 interconnects with the first groove R1. Next, the wet etching process, for example, using the diluted hydrofluoric acid (DHF), is employed for removing the silicon oxide film 130 in the first groove R1 and the silicon oxide film 132 in the second groove R2 (as shown in FIG. 2E), so that eventually the preparation of grooves in Si-substrate is accomplished. The lateral-depression-formed dry etching process involves employing a second plasma gas for etching the silicon substrate 110, wherein the second plasma gas, for example, is selected from the group consisting of hydrogen fluoride (HF), nitrogen trifluoride (NF3) and chlorine gas (Cl2) and a mixture thereof. Moreover, after forming the third grooves, for example, depending on the process requirement, it is possible to sequentially etch the other grooves in a circular shape or in a trench shape downwards; therefore, it is not intended to limit the invention to such an example. In the subsequent processes adapted for manufacturing fin field-effect transistor (FinFET) device, silicon germanium epitaxial layers are sequentially formed in the first, second and third grooves R1, R2, R3 consisting of the grooves in Si-substrate, so as to form an epitaxial drain structure or an epitaxial source structure.

It is worthy to mention that, the patterned protection layer is, for example, a patterned polymer film. Therefore, it is also possible to form the polymer film on the surface of the exposed silicon substrate 110 in the second groove R2, in replacement of forming the silicon oxide film on the silicon substrate 110 in the second groove R2 via carrying out the surface oxidation process thereon. Once the polymer film on the base Br2 is removed, the preparation of the patterned polymer film is accomplished. Then, a third etching process is subsequently carried out on the silicon substrate 110 at the base Br2, so as to form a plurality of third grooves R3. Finally, the wet etching process is carried out for removing the silicon oxide film and the polymer film remaining on respective sidewalls of the grooves, and thus, the preparation of grooves in Si-substrate is accomplished. The method of forming the polymer film involves, for example, employing $CH_2F_2$ gas or $CHF_3$ gas for depositing the polymer film.

Figure 3A:
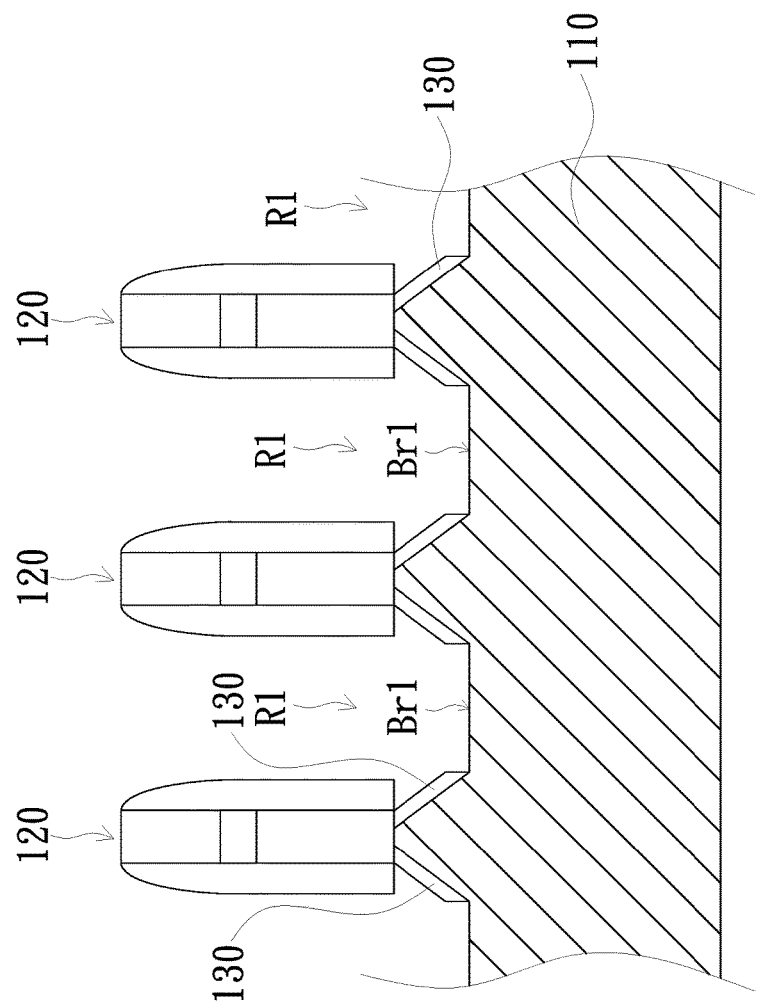
Figure 3B:
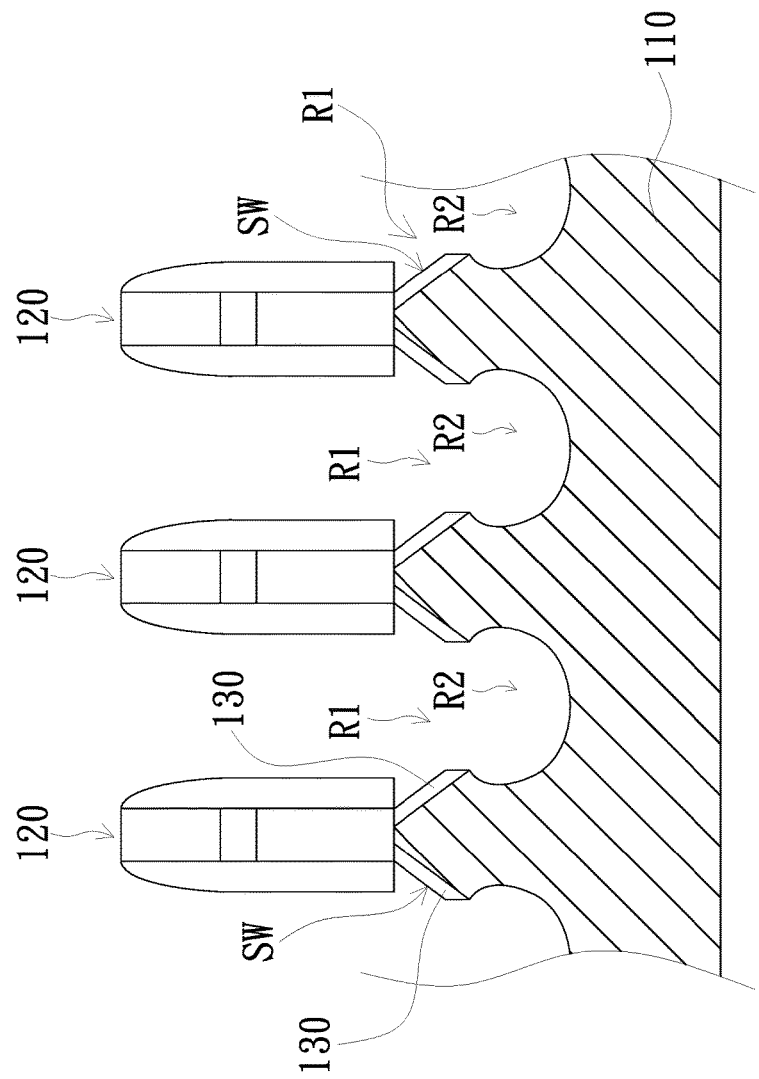

FIGS. 3A-3C are cross-sectional views illustrating an etching method adapted for forming grooves in Si-substrate according to yet another embodiment of the invention. In the FIGS. 1A-1F, an etching method of forming grooves in Si-substrate is provided; those are composed of the first grooves R1 with two ascending sidewalls Sw and the second grooves R2 in a trench shape or in a U shape (or rounded circular shape). However, in this embodiment, an etching method of forming grooves in Si-substrate is provided, which are composed of the first grooves R1 with two ascending sidewalls Sw and the second grooves R2 in a (rounded) circular shape, including preparing a device structure as illustrated in FIG. 1D firstly, which is depicted in FIG. 3A in detail. Prior to accomplishing the structure of FIG. 3A, the previous processes are all the same as those of FIGS. 1A-1C, and duplicated descriptions are thus omitted. As illustrated in FIG. 3A, the two inclined sidewalls Sw of the first groove R1 are still overlaid with the silicon oxide films 130, and the silicon oxide films 130 at the base Br1 has been removed. In FIG. 3A, the sidewalls Sw can be overlaid by the polymer film alternatively, in replacement of the silicon oxide film, and thus, it is not intended to limit the invention to such an example. Next, the second etching process, for example, a lateral-depression-formed dry etching process, is carried out on the silicon substrate 110 at the base Br1 of the first groove R1, so as to form a second groove R2 in a (rounded) circular shape (as shown in FIG. 3B, a width of the second groove R2 is wider than a width of a bottom (i.e. the base Br1) of the first groove R1, wherein both the widths of the second groove R2 and the first groove R1 are defined along a direction parallel to an extending direction of the silicon substrate 110), and then, the wet etching process, for example, using the diluted hydrofluoric acid (DHF), is still employed for removing the silicon oxide films 130 disposed on the sidewalls Sw (as shown in FIG. 3C), so as to accomplish the preparation of grooves in Si-substrate. Here, the inclined sidewalls Sw of the first groove R1 interconnect with the second groove R2 respectively. The lateral-depression-formed dry etching process involves employing a second plasma gas for etching the silicon substrate 110, wherein the second plasma gas, for example, is selected from the group consisting of hydrogen fluoride (HF), nitrogen trifluoride ($NF_3$) and chlorine gas ($Cl_2$) and a mixture thereof.

Figure 4A:
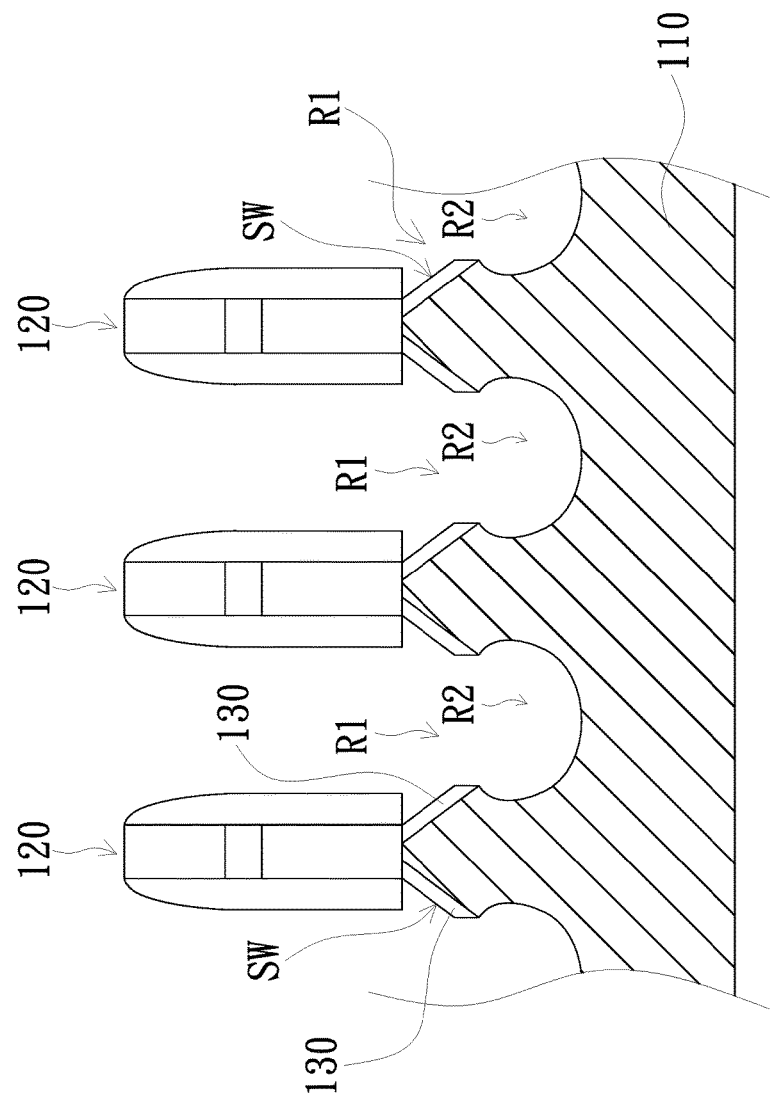
Figure 4B:
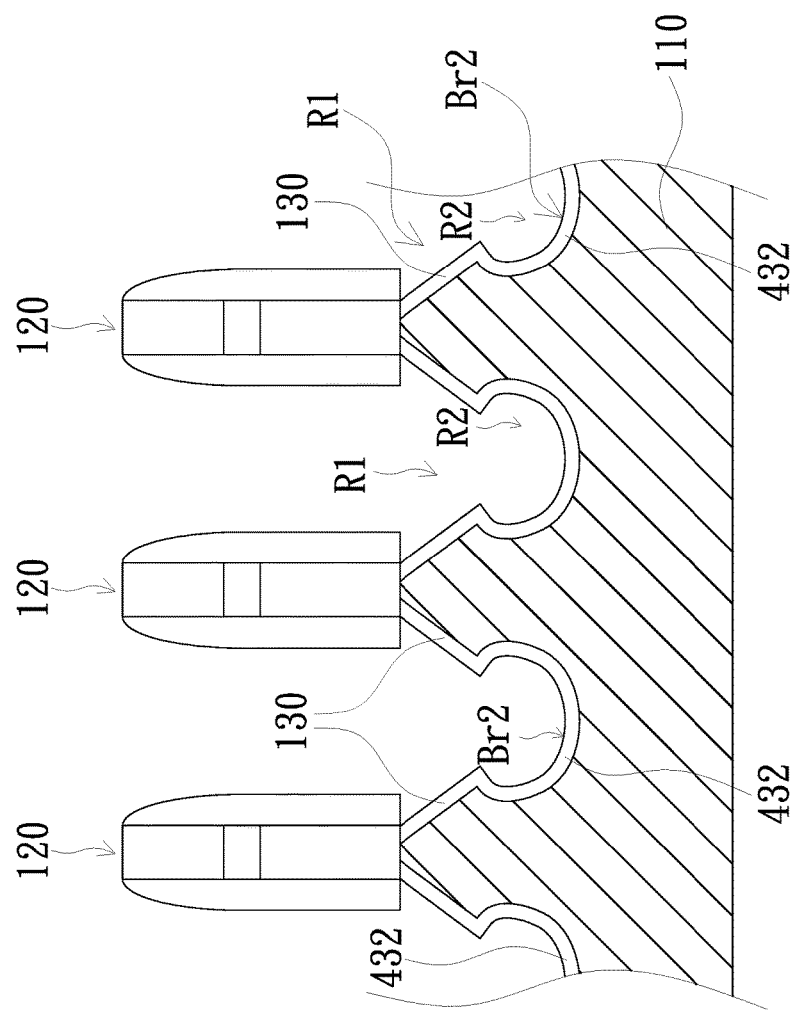
Figure 4C:
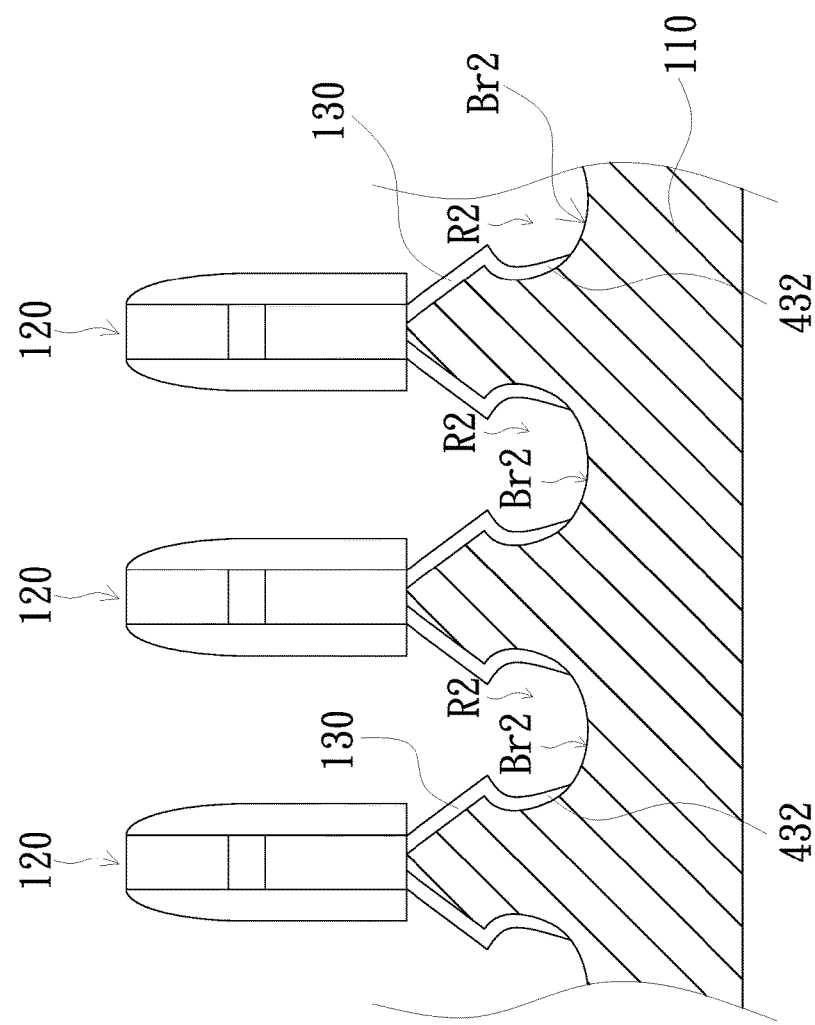
Figure 4E:
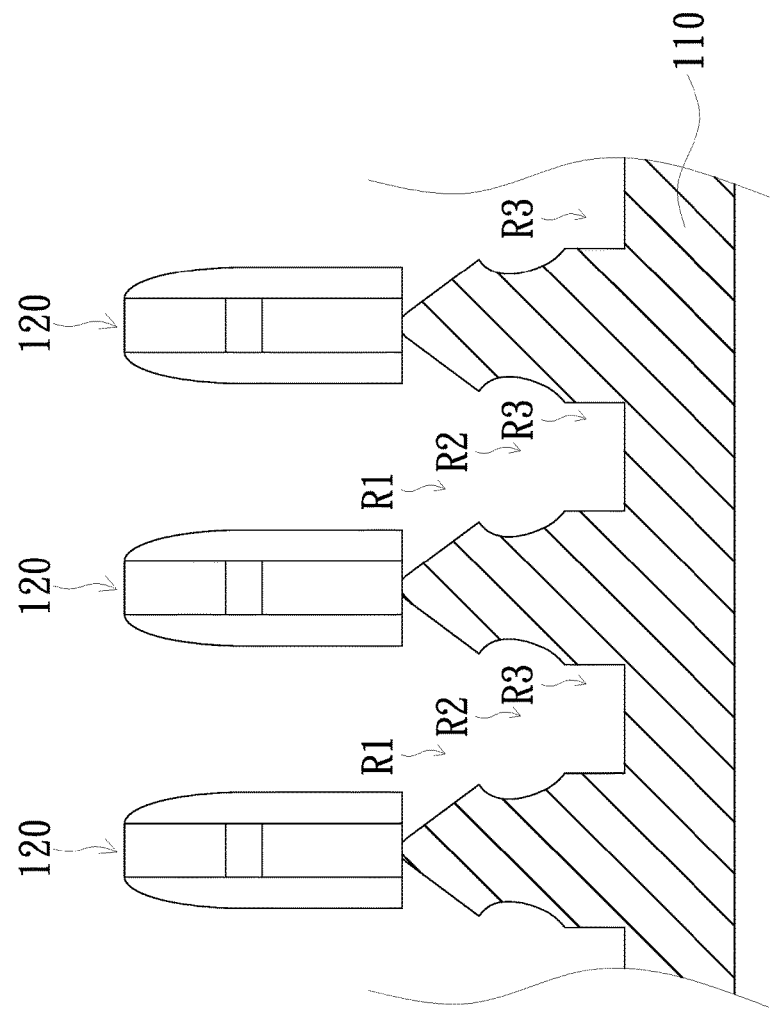

FIGS. 4A-4E are cross-sectional views illustrating an etching method adapted for forming grooves in Si-substrate according to still yet another embodiment of the invention. After forming the second groove R2 in the (rounded) circular shape as illustrated in FIG. 3B, for example, it is possible to sequentially etch the grooves configured in other shapes downwards, and the manufacturing processes are set forth below. Firstly, preparing a device structure as illustrated in FIG. 3B, which is depicted in FIG. 4A in detail. As illustrated in FIG. 4A, the two inclined sidewalls Sw of the first groove R1 are still overlaid with the silicon oxide films 130, and the second groove R2 is in a (rounded) circular shape. In FIG. 4A, the sidewalls Sw can be overlaid by a polymer film alternatively, in replacement of the silicon oxide film, and thus, it is not intended to limit the invention to such an example. Next, a patterned protection layer is formed in the second groove R2, wherein the base Br2 of the second groove R2 is exposed by the patterned protection layer. Here, the patterned protection layer is, for example, a patterned silicon oxide film, and steps of forming the patterned silicon oxide film in the second groove R2 involve performing a surface oxidation process on the exposed silicon substrate 110 in the second groove R2, so as to form a silicon oxide film 432 on the surface of the exposed silicon substrate 110 in the second groove R2 (as shown in FIG. 4B), and then, carrying out a breakthrough etching process for removing the silicon oxide film 432 at the base Br2 of the second groove R2, so that the silicon substrate 110 at the base Br2 is exposed (as shown in FIG. 4C), thus eventually the preparation of the patterned silicon oxide film is accomplished. Next, a third etching process, for example, a vertical-depression-formed dry etching process, is carried out on the silicon substrate 110 at the base Br2, so as to form a third groove R3 in a trench shape or in an U shape (as shown in FIG. 4D, a width of the second groove R2 is wider than a width of a bottom (i.e. the base Br1) of the first groove R1, wherein both the widths of the second groove R2 and the first groove R1 are defined along a direction parallel to an extending direction of the silicon substrate 110); and then, the wet etching process, for example, using the diluted hydrofluoric acid (DHF), is still employed for removing the silicon oxide film 130 disposed on the first groove R1 and the silicon oxide film 432 in the second groove R2, so as to accomplish the preparation of grooves in Si-substrate (as shown in FIG. 4E). The first plasma gas as employed in the vertical-depression-formed dry etching process is, for example, hydrogen bromide (HBr). Moreover, after forming the third grooves R3, for example, depending on the process requirement, it is possible to sequentially etch the other grooves in a (rounded) circular shape or in a trench shape downwards, therefore, it is not intended to limit the invention to such an example. In the subsequent processes adapted for manufacturing fin field-effect transistor (FinFET) device, silicon germanium epitaxial layers are sequentially formed in the first, second and third grooves R1, R2, R3 consisting of the grooves in Si-substrate, so as to form an epitaxial drain structure or an epitaxial source structure It is worthy to mention that, the patterned protection layer is, for example, a patterned polymer film. Therefore, in replacement of the step of performing the surface oxidation process on the silicon substrate 110 in the second groove R2 for forming silicon oxide film, an alternative embodiment is to form a polymer film on the surface of exposed silicon substrate 110 in the second groove R2. The same descriptions of subsequent processes are thus omitted.

Figure 5B:
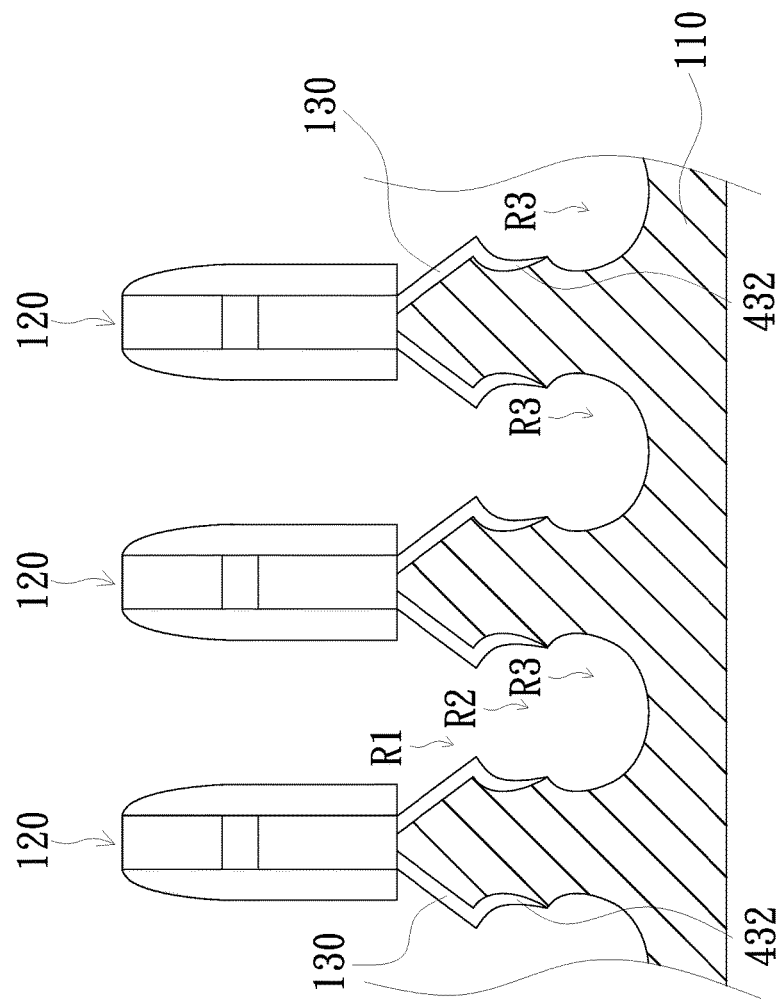
Figure 5C:
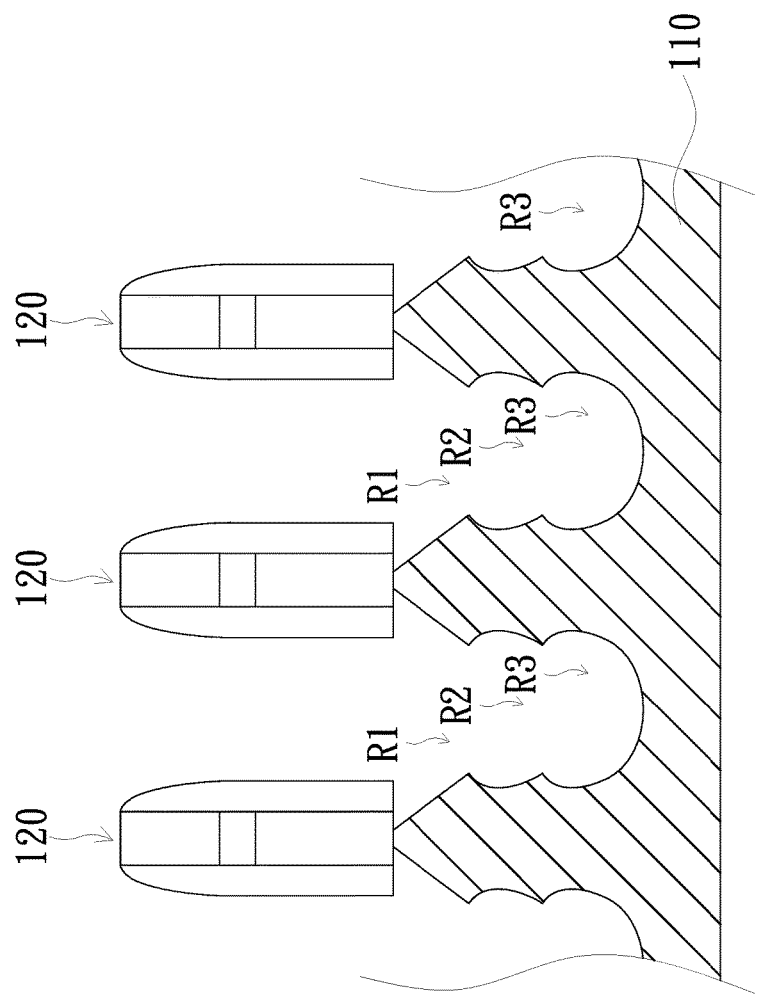

FIGS. 5A-5C are cross-sectional views illustrating an etching method adapted for forming grooves in Si-substrate according to still yet another embodiment of the invention. In the FIGS. 4A-4E, an etching method of forming grooves in Si-substrate is provided; which are composed of the first grooves R1 with two ascending sidewalls Sw, the second grooves R2 in a (rounded) circular shape, and the third grooves in a trench shape or in a U shape. However, in this embodiment, an etching method is provided, that is, after forming the second grooves in a (rounded) circular shape, it is sequential to etch the third grooves in a (rounded) circular shape downwards, that involves preparing a device structure as shown in FIG. 4C firstly, as depicted in FIG. 5A as well. As illustrated in FIG. 5A, the two inclined sidewalls Sw of the first groove R1 are still overlaid with the silicon oxide film 130, and the sidewall of the second groove R2 in the (rounded) circular shape is still overlaid with the silicon oxide film 432, and the silicon oxide film 432 at the base Br2 of the second groove R2 has been removed. Next, a third etching process, for example, a lateral-depression-formed dry etching process, is carried out on the silicon substrate 110 at the base Br2 of the second groove R2, so as to form a third groove R3 in a (rounded) circular shape (as shown in FIG. 5B), and then, the wet etching process, for example,
using the diluted hydrofluoric acid (DHF), is still employed for removing the silicon oxide films 130 disposed on the sidewalls Sw of the first groove R1 and the silicon oxide film 432 on the sidewall of the second groove (as shown in FIG. 5C, the second and third grooves R2 and R3 together form a figure-8 shape blind via), so as to accomplish the preparation of grooves in Si-substrate. Moreover, after forming the third grooves, for example, it is possible to sequentially etch the other grooves in a circular shape or in a trench shape downwards, therefore, it is not intended to limit the invention to such an example.

Figure 6:
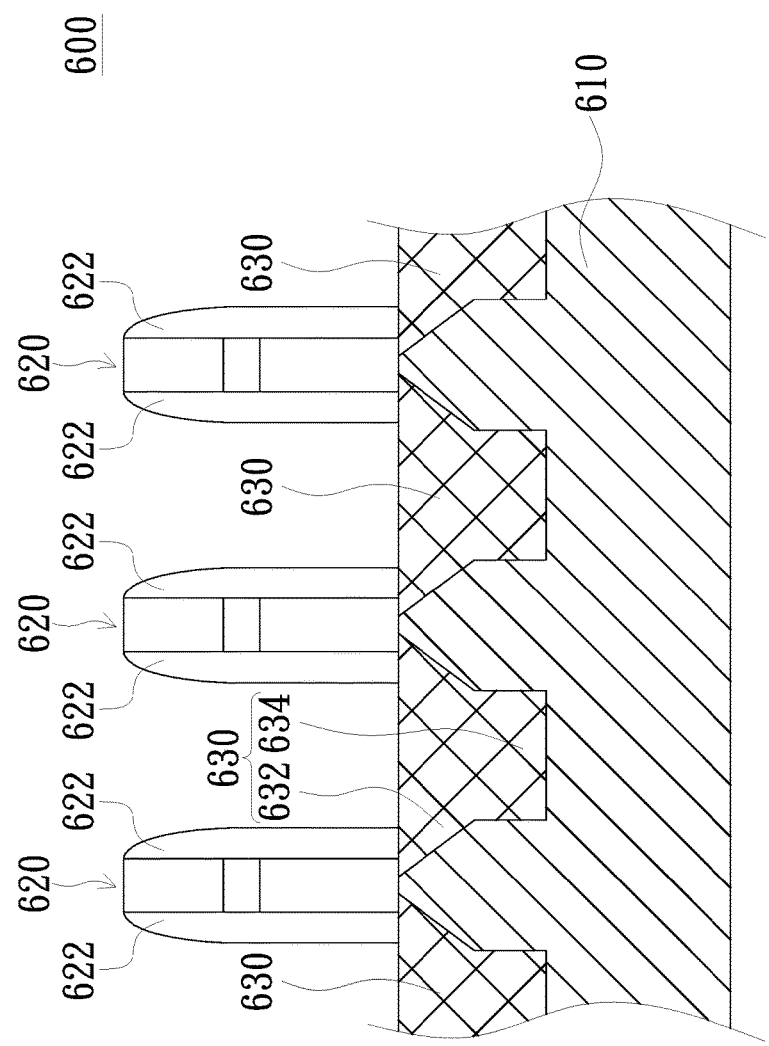
FIGS. 6-10 are schematic diagrams depicting fin field-effect transistors (FinFETs) according to still another embodiment of the invention.

FIG. 6 is a schematic diagram depicting fin field-effect transistor (FinFET) according to another embodiment of the invention. By referring to FIG. 6, a fin field-effect transistor (FinFET) 600 comprises a silicon substrate 610, at least two gate structures 620 disposed on the silicon substrate 610, at least two gate spacer structures 622, and a semiconductor structure 630. As illustrated in FIG. 6, it is exemplified by three gate structures 620 and three gate spacer structures 622; however, it is not intended to limit the invention to such an example. Each of the gate spacer structures 622 is disposed on the silicon substrate 610, and encircles respective sidewalls of the gate structures 620. The semiconductor structure 630 is embedded in the silicon substrate 610, and the semiconductor structure 630 has a plurality of ascending portions 632 and a first U-shaped portion 634 interconnected with the ascending portions 632, wherein the ascending portions 632 ascend to the bottoms of the neighboring gate structures 620. A material made up of the semiconductor structure 630 is, for example, a silicon germanium epitaxial material, and the semiconductor structure 630, for example, function as an epitaxial drain structure or an epitaxial source structure in the fin field-effect transistor (FinFET).

Figure 7:
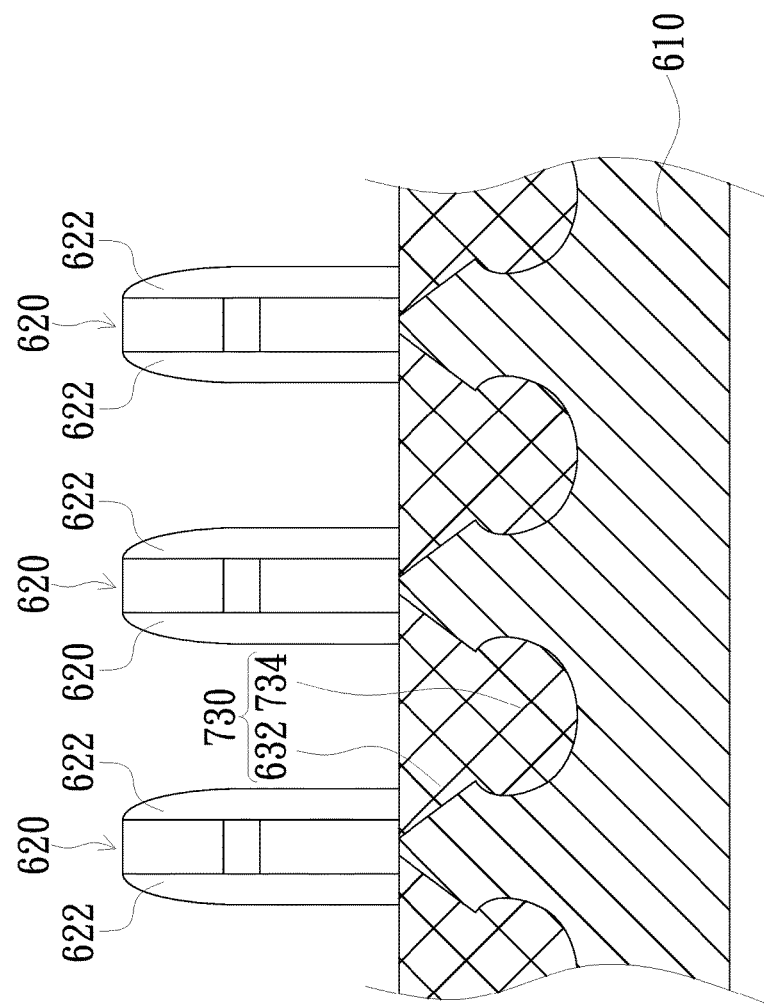
Figure 8:
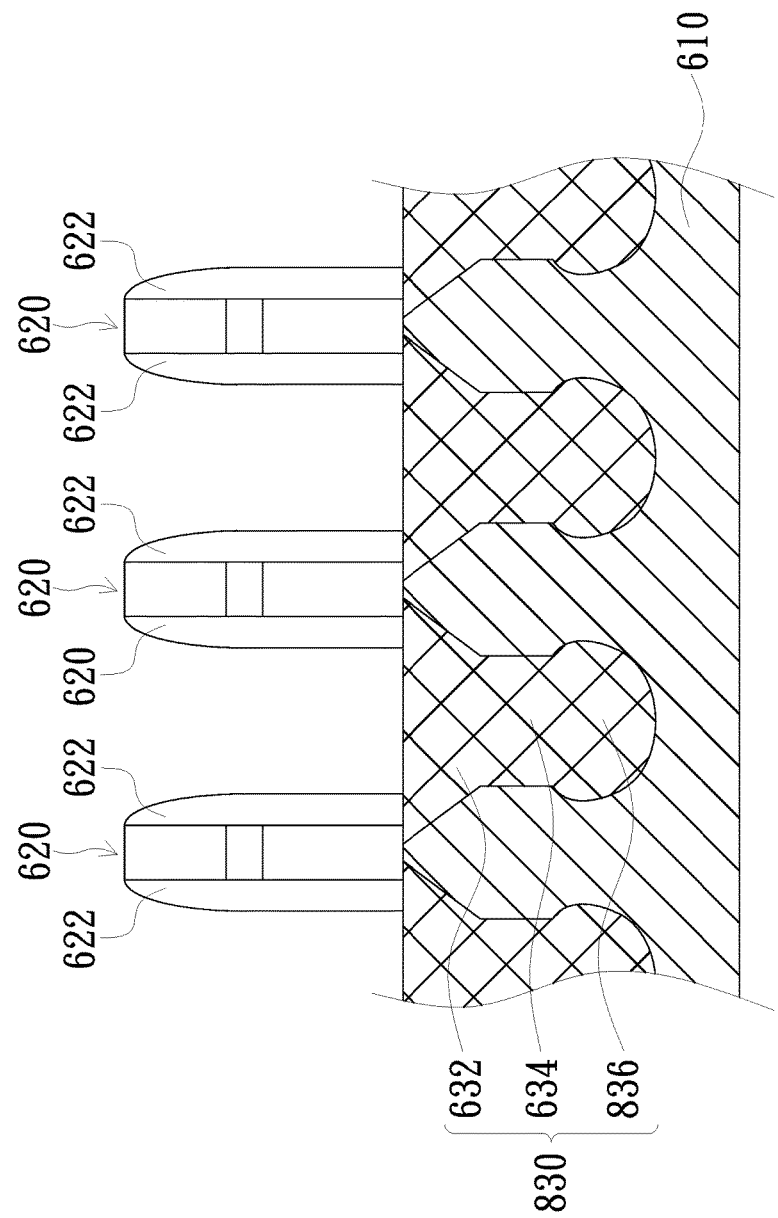
Figure 9:
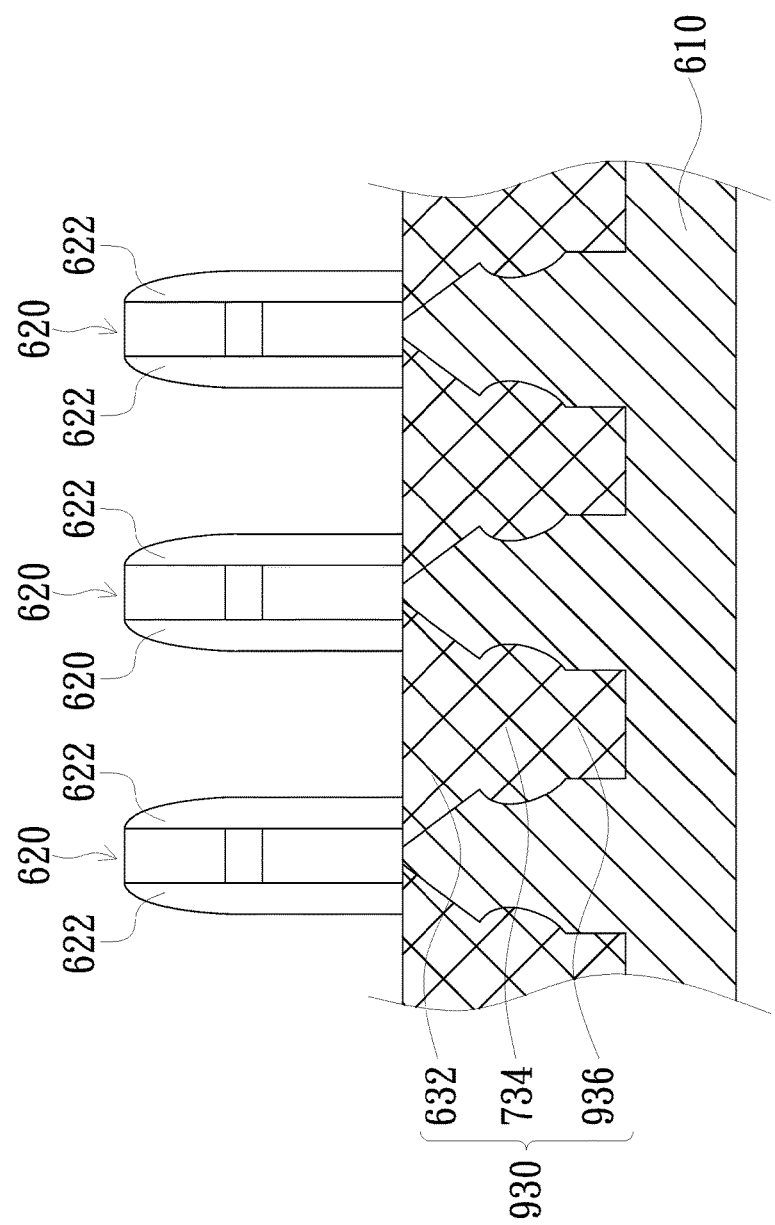
Figure 10:
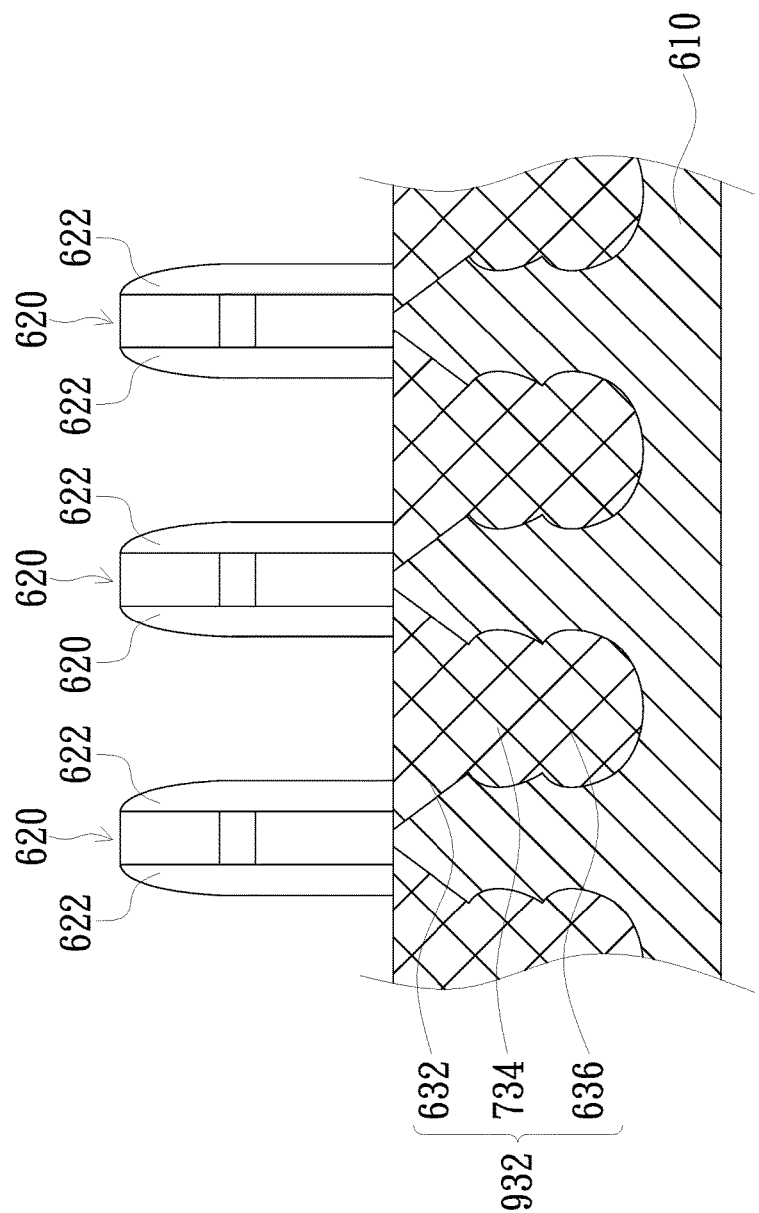

Moreover, It is worthy to mention that, depending on the process requirement or electrical requirement for device, according to the invention, the semiconductor structure in the fin field-effect transistor (FinFET), which is provided with the structure composed of the ascending portions 632 and the first U-shaped portion 634 as shown in FIG. 6, can be substituted with, for example, a semiconductor structure 730 as shown in FIG. 7, which has the ascending portions 632 and a first circular portion 734, in place of the semiconductor structure 630. Alternatively, the semiconductor structure 630 can be substituted by a semiconductor structure 830 as shown in FIG. 8, which has the ascending portions 632, a first U-shaped portion 634 and a second circular portion 836. Alternatively, the semiconductor structure 630 can be substituted with a semiconductor structure 930 as shown in FIG. 9, which has the ascending portions 632, the first circular portion 734, and a second circular portion 936. Alternatively, the semiconductor structure 630 can be substituted by a semiconductor structure 932 as shown in FIG. 10, which has the ascending portions 632, the first circular portion 734, and a second U-shaped portion 636.

According to the another embodiment of the invention, the device structure as illustrated in FIG. 6 is prepared by forming grooves in Si-substrate via the etching method as shown in FIGS. 1A-1F in advance, and then growing the silicon germanium epitaxial layer in the grooves in Si-substrate. The device structure as illustrated in FIG. 7 is prepared by forming grooves in Si-substrate via the etching method as shown in FIGS. 3A-3C in advance, and then growing the silicon germanium epitaxial layer in the grooves in Si-substrate. The device structure as illustrated in FIG. 8 is prepared by forming grooves in Si-substrate via the etching method as shown in FIGS. 2A-2E in advance, and then growing the silicon germanium epitaxial layer in the grooves in Si-substrate. The device structure as illustrated in FIG. 9 is prepared by forming grooves in Si-substrate via the etching method as shown in FIGS. 4A-4E in advance, and then growing the silicon germanium epitaxial layer in the grooves in Si-substrate. The device structure as illustrated in FIG. 10 is prepared by forming grooves in Si-substrate via the etching method as shown in FIGS. 5A-5C in advance, and then growing the silicon germanium epitaxial layer in the grooves in Si-substrate.

In summary, according to various embodiments of the invention, several etching methods for grooves in Si-substrate are provided, which involve forming the first grooves those have two ascending sidewalls to the bottom of gate structures by employing dry etching and wet etching processes in advance, next, performing surface oxidation processes on the sidewalls of the grooves for forming a silicon oxide film, in order to avoid an over-etching phenomenon, and then, performing a vertical-depression-formed dry etching process or a lateral-depression-formed dry etching process for forming a second groove and even a third groove subsequently, eventually the preparation of a various types of grooves in Si-substrate can be accomplished. Besides, the silicon germanium epitaxial layer is so grown in the grooves in Si-substrate as to serve as an epitaxial drain structure or an epitaxial source structure in the fin field-effect transistor (FinFET). Accordingly, it is possible to meet distinct electrical requirements for various devices.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A fin field-effect transistor (FinFET), comprising:
a silicon substrate;
at least two gate structures disposed on the silicon substrate;
at least two gate spacer structures disposed on the silicon substrate; and
a semiconductor structure, embedded in the silicon substrate, the semiconductor structure having an ascending top portion, a circular bottom portion, a trench-shaped connecting portion interconnecting the circular bottom portion with the ascending top portion,
wherein the ascending top portion ascends to respective bottoms of the gate structures, a top of the ascending top portion is in contact with a bottom of the gate structure, a width of the circular bottom portion is wider than a width of the trench-shaped connecting portion, and both the widths of the circular bottom portion and the trench-shaped connecting portion are defined along a direction parallel to an extending direction of the substrate, wherein entire structures and the widths of the ascending top portion and the trench-shaped connecting portion are achieved by means of having a conformal silicon oxide film disposed under the gate structure and directly on the substrate in a location corresponding to the ascending top portion and the trench-shaped connecting portion of the semiconductor structure during an etching process for forming the circular bottom portion while protecting the sidewall of the trench-shaped connecting portion from over-etching, and followed by removing of the conformal silicon oxide film via an another etching prior to forming of the semiconductor structure.

2. The fin field-effect transistor (FinFET) according to claim 1, wherein the semiconductor structure is made of a silicon germanium epitaxial material, and the semiconductor structure is an epitaxial drain structure or an epitaxial source structure.

3. A fin field-effect transistor (FinFET), comprising:
a silicon substrate;
at least two gate structures disposed on the silicon substrate;
at least two gate spacer structures disposed on the silicon substrate; and
a semiconductor structure, embedded in the silicon substrate, the semiconductor structure having an ascending top portion and a rounded circular portion interconnecting with a bottom of the ascending top portion, wherein the ascending top portion ascends to respective bottoms of the gate structures, a top of the ascending top portion is in contact with a bottom of the gate structure, and a width of the rounded circular portion is wider than a width of the bottom of the ascending top portion, and both the widths of the rounded circular portion and the bottom of the ascending top portion are defined along a direction parallel to an extending direction of the substrate, wherein entire structures and the widths of the ascending top portion and the rounded circular portion are achieved by means of having a conformal silicon oxide film disposed under the gate structure and directly on the substrate in a location corresponding to the ascending top portion and the rounded circular portion of the semiconductor structure during an etching process for forming the circular bottom portion while protecting the sidewall of the rounded circular portion from over-etching, and followed by removing of the conformal silicon oxide film via an another etching prior to forming of the semiconductor structure.

4. The fin field-effect transistor (FinFET) according to claim 3, wherein the semiconductor structure is made of a silicon germanium epitaxial material, and the semiconductor structure is an epitaxial drain structure or an epitaxial source structure.

5. The fin field-effect transistor (FinFET) according to claim 1, wherein the circular bottom portion is in a lateral-depression-formed shape and the trench-shaped connecting portion is in a vertical-depression-formed shape.

6. The fin field-effect transistor (FinFET) according to claim 1, wherein the ascending top portion has a wider top and narrower bottom, where connects with the trench-shaped connecting portion.

7. The fin field-effect transistor (FinFET) according to claim 3, wherein the ascending top portion has a wider top and narrower bottom, where connects with the rounded circular portion.

8. The fin field-effect transistor (FinFET) according to claim 3, wherein the semiconductor structure consists of the ascending top portion, the rounded circular portion and a trench-shaped bottom portion interconnecting with a bottom of the rounded circular portion.

9. The fin field-effect transistor (FinFET) according to claim 8, wherein the trench-shaped bottom portion is in a vertical-depression-formed shape and the rounded circular portion is in a lateral-depression-formed shape.

* * * * *